(12) United States Patent
Jung et al.

(10) Patent No.: US 9,660,145 B2
(45) Date of Patent: May 23, 2017

(54) LIGHT EMITTING DEVICE, LIGHT EMITTING DEVICE PACKAGE HAVING THE SAME AND LIGHT SYSTEM HAVING THE SAME

(71) Applicant: LG INNOTEK CO., LTD., Seoul (KR)

(72) Inventors: Sung Dal Jung, Seoul (KR); Jong Sub Lee, Seoul (KR); Hyun Don Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/996,842

(22) Filed: Jan. 15, 2016

(65) Prior Publication Data

US 2016/0218243 A1 Jul. 28, 2016

(30) Foreign Application Priority Data

Jan. 26, 2015 (KR) ........................ 10-2015-0011847

(51) Int. Cl.
| | | |
|---|---|---|
| H01L 33/00 | (2010.01) | |
| H01L 33/38 | (2010.01) | |
| H01L 29/872 | (2006.01) | |
| H01L 33/62 | (2010.01) | |
| H01L 33/40 | (2010.01) | |
| H01L 33/30 | (2010.01) | |

(52) U.S. Cl.
CPC .......... *H01L 33/387* (2013.01); *H01L 29/872* (2013.01); *H01L 33/0008* (2013.01); *H01L 33/30* (2013.01); *H01L 33/38* (2013.01); *H01L 33/40* (2013.01); *H01L 33/62* (2013.01)

(58) Field of Classification Search
CPC ........ H01L 33/38; H01L 29/872; H01L 33/62
See application file for complete search history.

(56) References Cited

U.S. PATENT DOCUMENTS

| | | | | |
|---|---|---|---|---|
| 4,679,043 A | * | 7/1987 | Morokawa | ........... G09G 3/3644 345/103 |
| 4,859,616 A | * | 8/1989 | Losehand | ........... H01L 29/0638 257/473 |
| 2003/0129813 A1 | * | 7/2003 | Lu | ................... H01L 31/022408 438/571 |
| 2006/0157718 A1 | | 7/2006 | Seo et al. | |
| 2011/0057199 A1 | | 3/2011 | Pan et al. | |
| 2011/0233602 A1 | | 9/2011 | Hwang et al. | |
| 2011/0284908 A1 | * | 11/2011 | Muramoto | .............. H01L 33/38 257/98 |

FOREIGN PATENT DOCUMENTS

EP 2 369 646 A1 9/2011

OTHER PUBLICATIONS

European Search Report dated Apr. 12, 2016 issued in Application No. 16152479.8.

* cited by examiner

*Primary Examiner* — Ngan Ngo
(74) *Attorney, Agent, or Firm* — Ked & Associates, LLP (57) ABSTRACT

A light emitting device is provided that may include a substrate, a light emitting structure including a first conductive semiconductor layer, an active layer, and a second conductive semiconductor layer provided on the substrate, a first electrode on the first conductive semiconductor layer, and a schottky guide ring configured to surround the first electrode and directly connect with the first conductive semiconductor layer.

22 Claims, 8 Drawing Sheets

LIGHT EMITTING DEVICE, LIGHT EMITTING DEVICE PACKAGE HAVING THE SAME AND LIGHT SYSTEM HAVING THE SAME

CROSS-REFERENCE TO RELATED APPLICATION

This application claims under 35 U.S.C. §119 to Korean Patent Application No. 10-2015-0011847 filed Jan. 26, 2015, which is incorporated herein by reference in its entirety.

BACKGROUND

1. Field

Embodiments disclosed herein relate to a light emitting device, a light emitting device package, and a light system including the same.

2. Background

A light emitting diode (LED) includes a P-N junction diode having a characteristic of converting electric energy into light energy and may be formed by using compound semiconductors of group III-V elements on the periodic table. The LED may emit various colors realized by adjusting the compositional ratio of the compound semiconductors.

When a forward voltage is applied to an LED, as electrons of an N layer are combined with holes of a P layer, energy is released across an energy gap between a conduction band and a valence band. In the case of the LED, the energy is released in the form of light.

For example, nitride semiconductors have been highlighted in the field of optical devices and high-power electronic devices due to excellent thermal stability and wide bandgap energy. Blue, green, and ultraviolet (UV) light-emitting devices employing nitride semiconductors have already been commercialized and extensively used.

As LED technologies are rapidly advanced, efforts to apply the LED to various fields, such as, e.g., optical communication, general lighting, or displays, beyond conventional uses of the LED, may be made. One of factors that may influence the reliability of the LED may be a maximum voltage that allows the LED to withstand electrostatic discharge (ESD). The ESD is a phenomenon in which energy may be instantly discharged from an electrically charged object due to dielectric breakdown of a surrounding medium or contact with a grounding body.

A zener diode may serve as a device for protecting from ESD shock if mounted in a package together with the LED. However, costs of fabricating the package may increase, fabrication may be complicated, and light absorption may occur.

BRIEF DESCRIPTION OF THE DRAWINGS

The embodiments will be described in detail with reference to the following drawings in which like reference numerals refer to like elements wherein.

DETAILED DESCRIPTION

Figure 1:
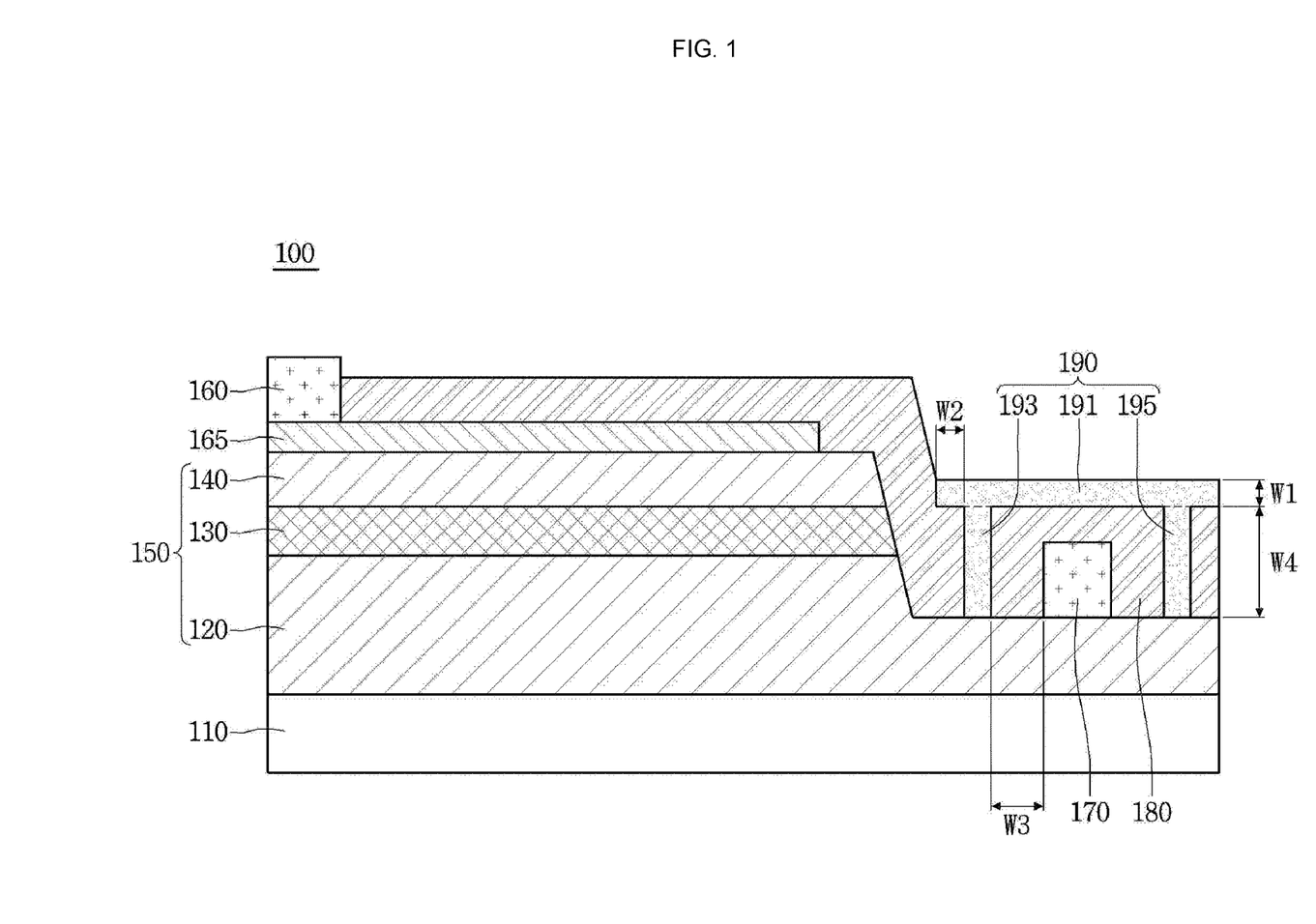
FIG. 1 is a sectional view of a light emitting device according to an embodiment.

FIG. 1 is a sectional view of a light emitting device according to an embodiment. The light emitting device 100 according to the embodiment may include a substrate 110, a light emitting structure 150 including a first conductive semiconductor layer 120, an active layer 130, and a second conductive semiconductor layer 140 on the substrate 110, an ohmic contact layer 165 on the second conductive semiconductor layer 140, a second electrode 160 on the ohmic contact layer 165, a first electrode 170 on the first conductive semiconductor layer 120, an insulating layer 180 to cover the light emitting structure 150, the first electrode 170, and the ohmic contact layer 165, and a schottky guide ring 190 formed through the insulating layer 180 while being formed on the insulating layer 180.

The substrate 110 may be formed of a material having superior thermal conductivity and may include at least one of a conductive substrate or an insulating substrate. For example, the substrate 110 may include at least one of, e.g., sapphire ($Al_2O_3$), SiC, Si, GaAs, GaN, ZnO, GaP, InP, Ge, and $Ga_2O_3$. A concavo-convex structure may be formed on the substrate 110 and may have, for example, a circular, oval, or polygonal sectional surface, but the embodiment is not limited thereto.

In this case, a buffer layer may be formed on the substrate 110 to reduce lattice mismatch between a material of the light emitting structure and the substrate 110. The material of the buffer layer may include at least one of group III-V compound semiconductors, such as, e.g., GaN, InN, AlN, InGaN, AlGaN, InAlGaN, and AlInN.

The light emitting structure 150 may be provided on the substrate 110. The light emitting structure 150 may include the first conductive semiconductor layer 120, the active layer 130 and the second conductive semiconductor layer 140. The first conductive semiconductor layer 120 may include group III-V compound semiconductors doped with first conductive dopants, and the first conductive semiconductor layer 120 may have a compositional formula of $In_xAl_yGa_{1-x-y}N$ ($0 \leq x \leq 1$, $0 \leq y \leq 1$, $0 \leq x+y \leq 1$). For example, the first conductive semiconductor layer 120 may include a lamination structure of layers including at least one of compound semiconductors, such as, e.g., GaN, InN, AlN, InGaN, AlGaN, InAlGaN, AlInN, AlGaAs, GaP, GaAs, GaAsP, and AlGaInP. The first conductive semiconductor layer 120 may be an N type semiconductor layer. The first conductive dopant may include, for example, Si, Ge, Sn, Se, or Te serving as an N type dopant. An electrode may be further provided on the first conductive semiconductor layer 120.

The active layer 12 may emit light due to a difference in the energy band gap between materials constituting the active layer 130 through a combination of electrons (or holes) injected through the first conductive semiconductor layer 120 and holes (or electrons) injected through the second conductive semiconductor layer 140. The active layer 130 may have one of a single quantum well (SQW) structure, a multi-quantum well (MQW) structure, a quantum dot structure, and a quantum wire structure, but the embodiment is not limited thereto.

The second conductive semiconductor layer 140 may include a semiconductor doped with second conductive dopants and may have a compositional formula of, for example, InxAlyGa1-x-yN (0≤x≤1, 0≤y≤1, 0≤x+y≤1). The second conductive semiconductor layer 140 may include one of compound semiconductors, such as, e.g., GaN, InN, AlN, InGaN, AlGaN, InAlGaN, AlInN, AlGaAs, GaP, GaAs, GaAsP, and AlGaInP. The second conductive semiconductor layer 140 may be a P type semiconductor layer, and the second conductive dopant may include, for example, Mg, Zn, Ca, Sr, or Ba serving as a P type dopant.

The second conductive semiconductor layer 140 may include a superlattice structure. The superlattice structure may include an InGaN/GaN superlattice structure or an AlGaN/GaN superlattice structure. The superlattice structure of the second conductive semiconductor layer 140 may abnormally spread currents of voltage to protect the active layer.

According to the embodiment, the light emitting structure 150 may be provided with opposite conductive or conductivity types. For example, the first conductive semiconductor layer 120 may serve as a P type semiconductor layer, and the second conductive semiconductor layer 140 may serve as an N type semiconductor layer. A first conductive semiconductor layer having a polarity opposite to a polarity of the second conductive semiconductor layer 140 may be additionally provided on the second conductive semiconductor layer 140.

The light emitting structure 150 may have one of an N-P junction structure, a P-N junction structure, an N-P-N junction structure, and a P-N-P junction structure, where "P" represents a P type semiconductor, N represents an N type semiconductor, and "-" represents that the P type semiconductor layer may directly or indirectly make contact with the N type semiconductor layer.

The light emitting structure 150 may have a horizontal type structure, a vertical type structure or a via hole type of a vertical structure. Although the light emitting structure 150 and the substrate 110 have been described as separate components, the substrate 110 may be included as a component of the light emitting structure 150.

The ohmic contact layer 165 may be provided on the light emitting structure 150. The ohmic contact layer 165 may be formed to make contact with the light emitting structure 150. For example, the ohmic contact layer 165 may include at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO.

The first electrode 170 may be provided on the first conductive semiconductor layer 120 by etching a portion of the light emitting structure 150. The first electrode 170 may include at least one selected from the group consisting of Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The second electrode 160 may be provided on the ohmic contact layer 165 to electrically connect the second conductive semiconductor layer 140. The second electrode 160 may be connected with an external power source to supply power to the light emitting structure 150. The second electrode 160 may include at least one selected from the group consisting of Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The insulating layer 180 may be provided on the light emitting structure 150, the first electrode 170, and the ohmic contact layer 165 and may include at least one of an oxide and a nitride. For example, the insulating layer 180 may include at least one selected from the group consisting of $SiO_2$, $Si_xO_y$, $Si_3N_4$, $Si_xN_y$, $SiO_xN_y$, $Al_2O_3$, $TiO_2$, and AlN.

According to the embodiment, the schottky guide ring 190 may include a first schottky guide ring 191 provided on the insulating layer 180, a second schottky guide ring 193 formed through the insulating layer 180, and a third schottky guide ring 195. The first schottky guide ring 191 may include a first metallic layer including at least one of Ag and Al and a second metallic layer including Ni formed under the first metallic layer. A thickness W1 of the first schottky guide ring 191 may be a sum between the thicknesses of the first metallic layer and the second metallic layer. The thickness of the first metallic layer may be in the range of 200 nm to 300 nm, and the thickness of the second metallic layer may be in the range of 0.5 nm to 2 nm, but the embodiment is not limited thereto.

The first schottky guide ring 191 may be connected with and perpendicular to the second schottky guide ring 193 and the third schottky guide ring 195. The first schottky guide ring 191 may have protrusions at side portions thereof connected with the second schottky guide ring 193 and the third schottky guide ring 195. A width W2 of each protrusion may be in the range of 2 μm to 3 μm, but the embodiment is not limited thereto. Heights W4 of the second schottky guide ring 193 and the third schottky guide ring 195 may be in the range of 0.7 μm to 1 μm, but the embodiment is not limited thereto.

An interval W3 between the first electrode 170 and the second schottky guide ring 193 may be equal to an interval between the first electrode 170 and the third schottky guide ring 195. The interval W3 between the first electrode 170 and the second schottky guide ring 193 may be 0.5 μm, but the embodiment is not limited thereto.

The schottky guide ring 190 may make contact with the first conductive semiconductor layer 120, and the intensity of an electric field applied to the first electrode 170 may be distributed by the schottky guide ring 190 so that the intensity of the electric field may be lowered.

Figure 2:
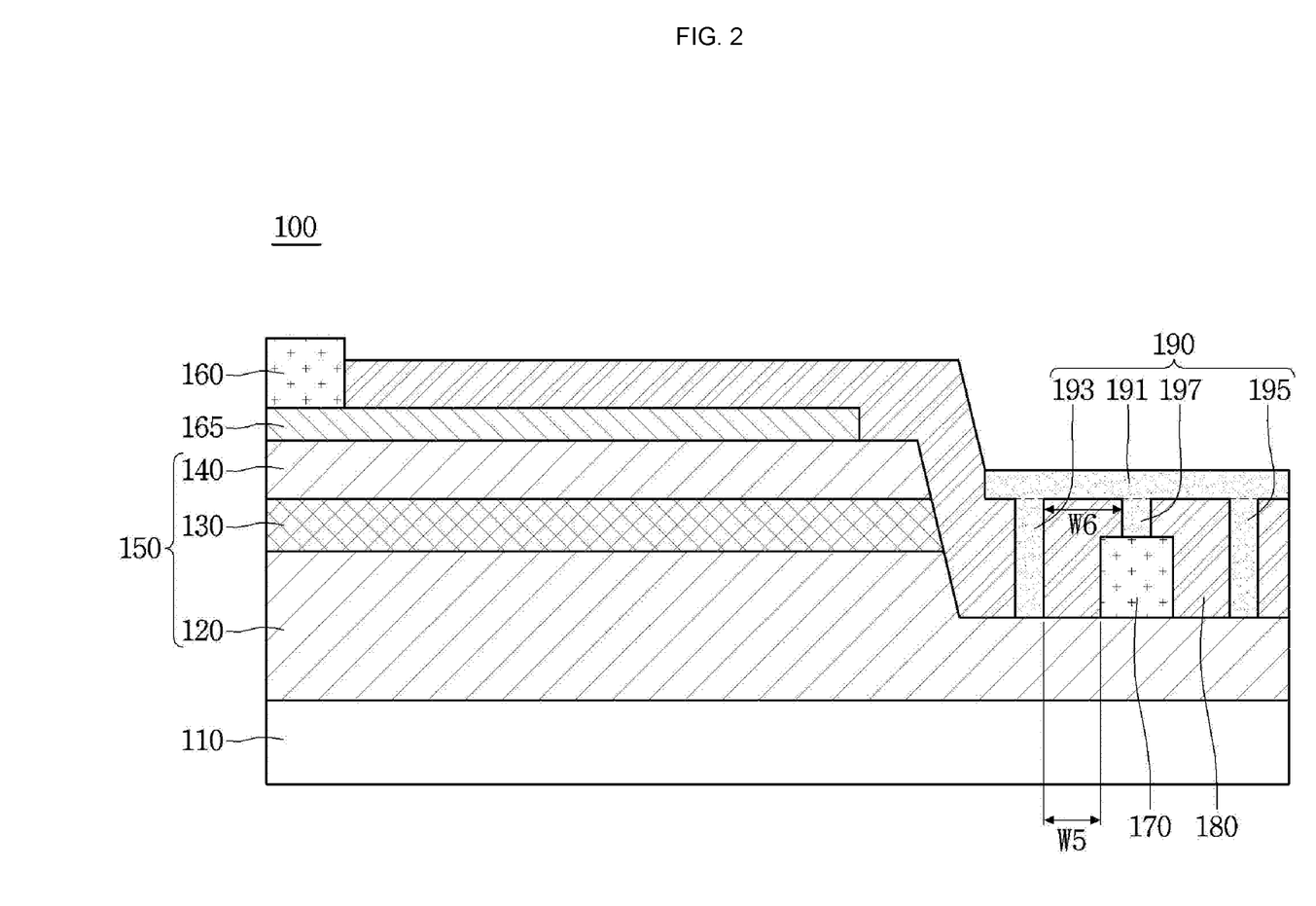
FIG. 2 is a sectional view of a light emitting device according to another embodiment.

FIG. 2 is a sectional view of a light emitting device according to another embodiment. The light emitting device 100 according to the another embodiment may be the same as the light emitting device shown in FIG. 1 except for a structure of the schottky guide ring 190, and thus, details of same or similar components and/or configurations are omitted.

According to the another embodiment, the schottky guide ring 190 may include a first schottky guide ring 191 provided on the insulating layer 180, second and third schottky guide rings 193 and 195 formed through the insulating layer 180, and a fourth schottky guide ring 197 additionally provided on the first electrode 170 and directly connected with the first schottky guide ring 191.

The first schottky guide ring 191 may include a first metallic layer including at least one of Ag and Al and a second metallic layer including Ni formed under the first metallic layer. A thickness W1 of the first schottky guide ring 191 may be a sum of thicknesses of the first and second metallic layers, a thickness of the first metallic layer may be in the range of 200 nm to 300 nm, and a thickness of the second metallic layer may be in the range of 0.5 nm to 2 nm, but the embodiment is not limited thereto.

An interval W6 between the second and fourth schottky guide rings 193 and 197 may be wider than a width W5 between the second schottky guide ring 193 and the first electrode 170.

The schottky guide ring 190 may make contact with the first conductive semiconductor layer 120, and the intensity of an electric field applied to the first electrode 170 may be distributed by the schottky guide ring 190 so that the intensity of the electric field may be lowered. In addition, the first schottky guide ring 191 may have protrusions at side portions thereof connected with the second schottky guide ring 193 and the third schottky guide ring 195, respectively, thereby minimizing a current concentration phenomenon.

Although a zener diode connected with a light emitting device in parallel may be mounted in a package to prevent the active layer from being damaged due to the ESD of the light emitting device, a problem related to light absorption may occur and an additional process may be required due to the connection with the zener diode. In the light emitting device 100 according to the embodiment, protection from the ESD may be possible without the zener diode so that the problem related to the light absorption may be solved, and the additional process may not be required.

Figure 3:
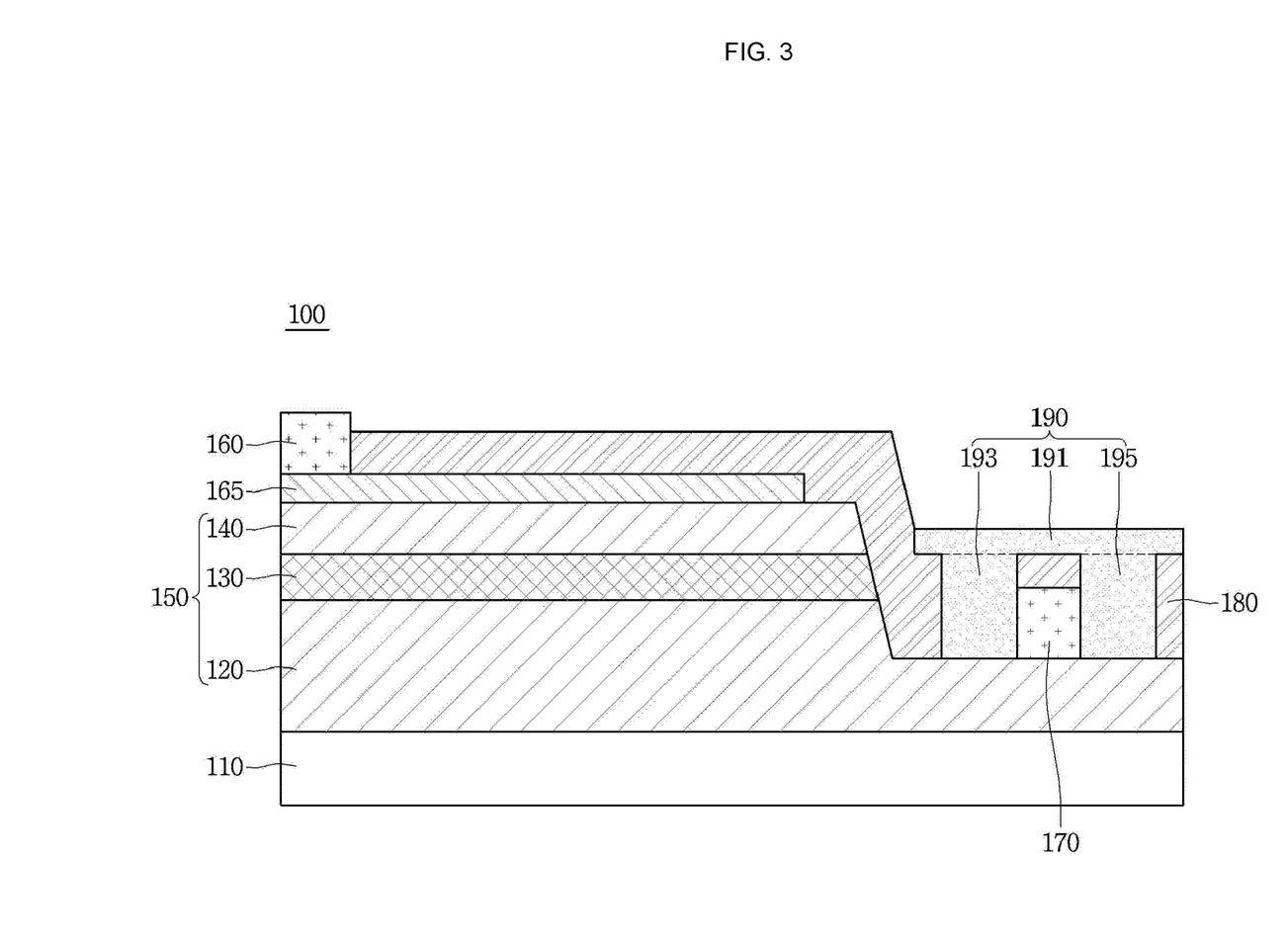
FIG. 3 is a sectional view of a light emitting device according to a still another embodiment.

FIG. 3 is a sectional view of a light emitting device according to a still another embodiment. The light emitting device 100 according to the embodiment is the same as the light emitting device shown in FIG. 1 except for a structure of the schottky guide ring 190, and thus, details of same or similar components and/or configurations are omitted.

According to the embodiment, the schottky guide ring 190 may include a first schottky guide ring 191 provided on the insulating layer 180 and second and third schottky guide rings 193 and 195 formed through the insulating layer 180. The first schottky guide ring 191 may include a first metallic layer including at least one of Ag and Al and a second metallic layer including Ni formed under the first metallic layer. A thickness W1 of the first schottky guide ring 191 may be a sum between thicknesses of the first metallic layer and the second metallic layer, a thickness of the first metallic layer may be in the range of 200 nm to 300 nm, and a thickness of the second metallic layer may be in the range of 0.5 nm to 2 nm, but the embodiment is not limited thereto.

The second schottky guide ring 193 and the third schottky guide ring 195 may be electrically connected with the first electrode 170, and the insulating layer 180 may be provided at an upper portion of the first electrode 170.

The schottky guide ring 190 may make contact with the first conductive semiconductor layer 120, and the intensity of an electric field applied to the first electrode 170 may be distributed by the schottky guide ring 190 so that the intensity of the electric field may be lowered.

Figure 4:
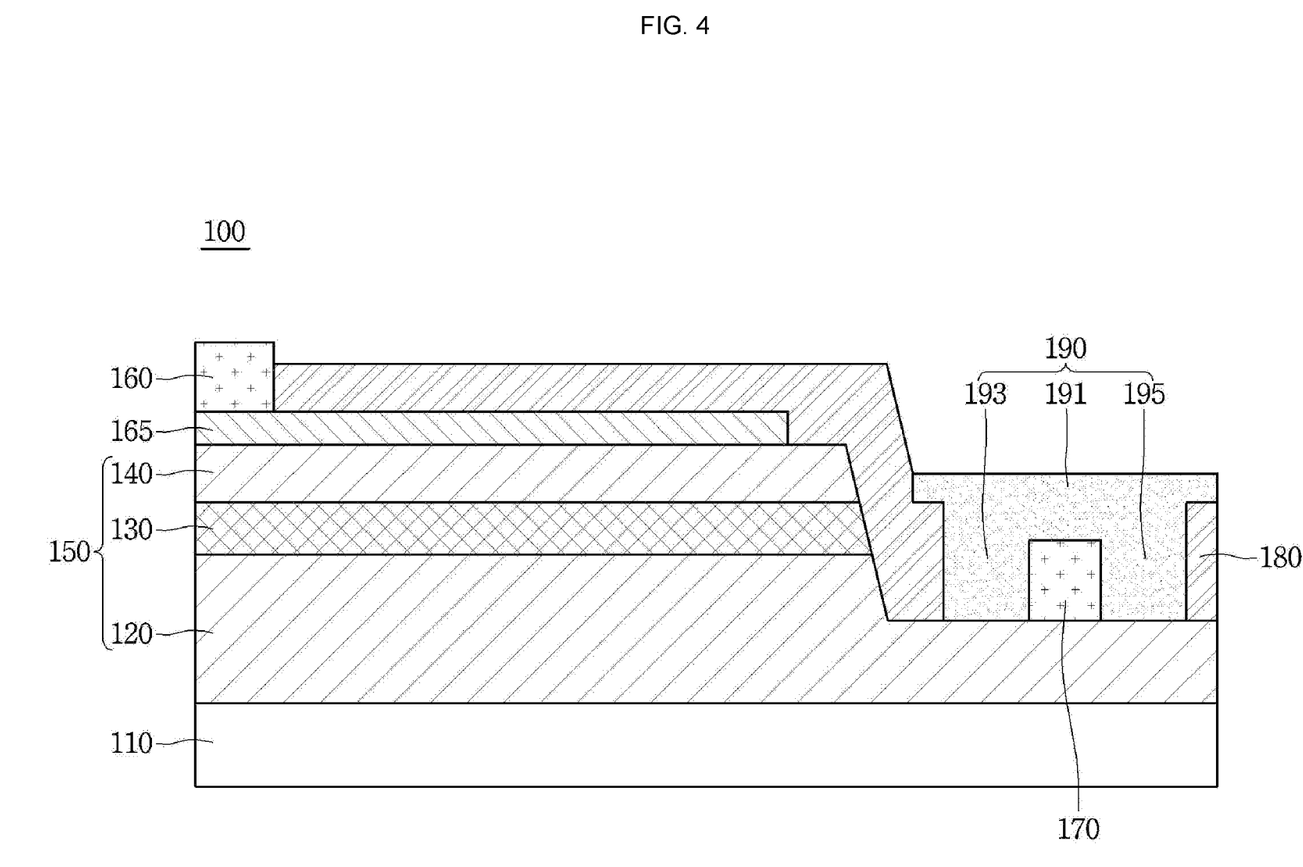
FIG. 4 is a sectional view of a light emitting device according to a still another embodiment.

FIG. 4 is a sectional view of a light emitting device according to still another embodiment. The light emitting device 100 according to the embodiment is the same as the light emitting device shown in FIG. 1 except for a structure of the schottky guide ring 190, and thus, details of same or similar components and/or configurations are omitted.

The schottky guide ring 190 may include a first schottky guide ring 191, a second schottky guide ring 193, and a third schottky guide ring 195 surrounding a first electrode 170. The first schottky guide ring 191 may include a first metallic layer including at least one of Ag and Al and a second metallic layer including Ni formed under the first metallic layer. A thickness W1 of the first schottky guide ring 191 may be a sum between thicknesses of the first metallic layer and the second metallic layer, a thickness of the first metallic layer may be in the range of 200 nm to 300 nm, and a thickness of the second metallic layer may be in the range of 0.5 nm to 2 nm, but the embodiment is not limited thereto.

The second schottky guide ring 193 and the third schottky guide ring 195 may directly make contact with the first electrode 170, and the insulating layer 180 may be provided on the first electrode 170.

The schottky guide ring 190 may make contact with the first conductive semiconductor layer 120, and the intensity of an electric field applied to the first electrode 170 may be distributed by the schottky guide ring 190 so that the intensity of the electric field may be lowered.

Figure 5:
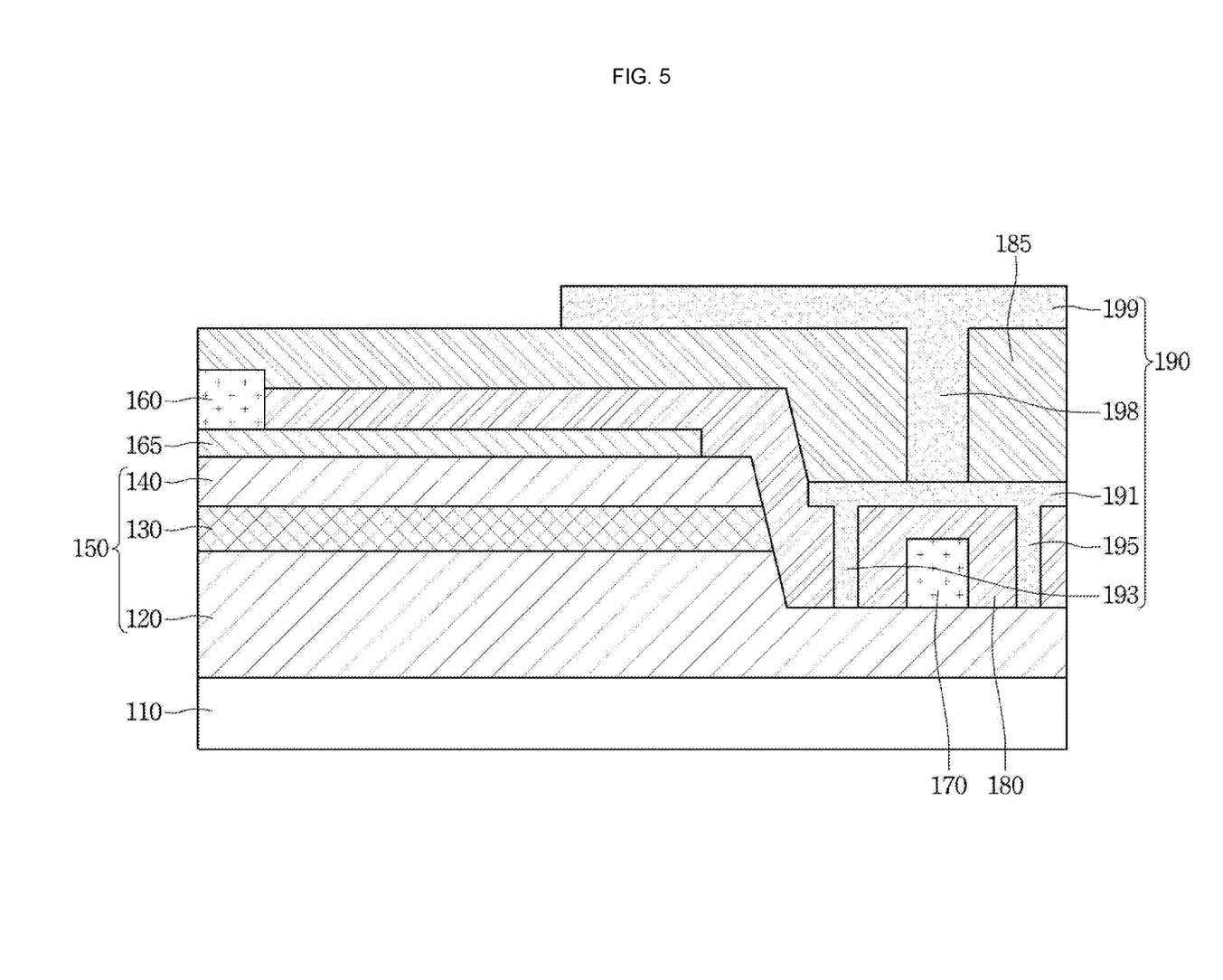
FIG. 5 is a sectional view of a light emitting device according to a still another embodiment.

FIG. 5 is a sectional view of a light emitting device according to still another embodiment. A light emitting device 100 according to the embodiment may include a substrate 110, a light emitting structure 150 formed on the substrate 110 and including a first conductive semiconductor layer 120, an active layer 130, and a second conductive semiconductor layer 140, a first electrode 170 on the first conductive semiconductor layer 120, a schottky guide ring 190 directly connected with the first conductive semiconductor layer 120 and surrounding the first electrode 170, a first insulating layer 180 provided between the first electrode 170 and the schottky guide ring 190, and a second insulating layer 185 provided on the first insulating layer 180.

The schottky guide ring 190 may include a first schottky guide ring 191 on the first insulating layer 180, second and third schottky guide rings 193 and 195 formed through the first insulating layer 180 and vertically connected with the first schottky guide ring 191, a fifth schottky guide ring 198 formed through the second insulating layer 185 and perpendicularly connected with the first schottky guide ring 191, and a sixth schottky guide ring 199 provided on the second insulating layer 185 and vertically connected with the fifth schottky guide ring 198.

The first schottky guide ring 191 may include a first metallic layer including at least one of Ag and Al and a second metallic layer including Ni formed under the first metallic layer. A thickness W1 of the first schottky guide ring 191 may be a sum between the thicknesses of the first metallic layer and the second metallic layer, a thickness of the first metallic layer may be in the range of 200 nm to 300 nm, and a thickness of the second metallic layer may be in the range of 0.5 nm to 2 nm, but the embodiment is not limited thereto.

The second schottky guide ring 193 and the third schottky guide ring 195 may directly make contact with the first electrode 170, and the first insulating layer 180 may be provided on the first electrode 170. A width of the fifth schottky guide ring 198 may be equal to a width of the first electrode 170, but the embodiment is not limited thereto.

The schottky guide ring 190 may make contact with the first conductive semiconductor layer 120, and the intensity of an electric field applied to the first electrode 170 may be distributed by the schottky guide ring 190 so that the intensity of the electric field may be lowered.

Figure 6:
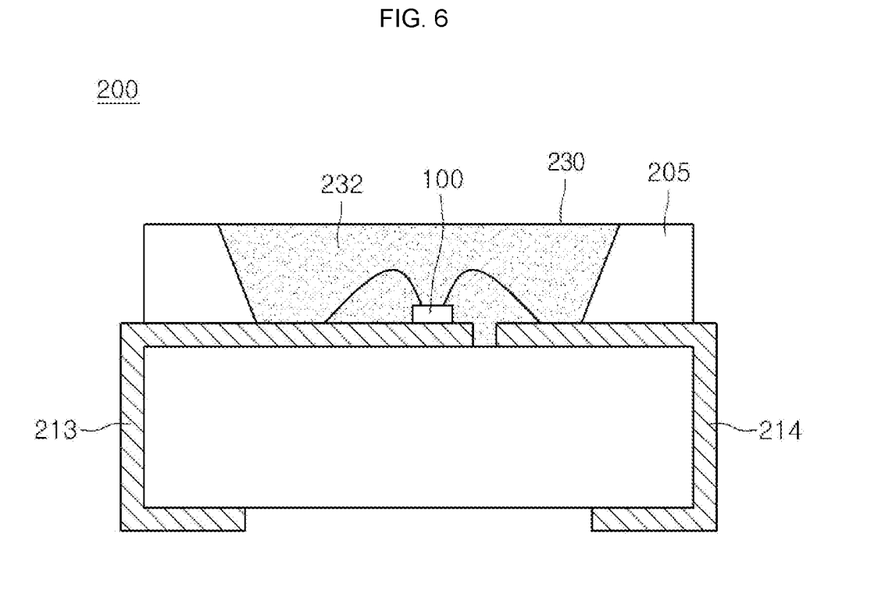
FIGS. 6 to 8 are exploded perspective views of embodiments of a light system including a light emitting device according to the embodiment.
Figure 7:
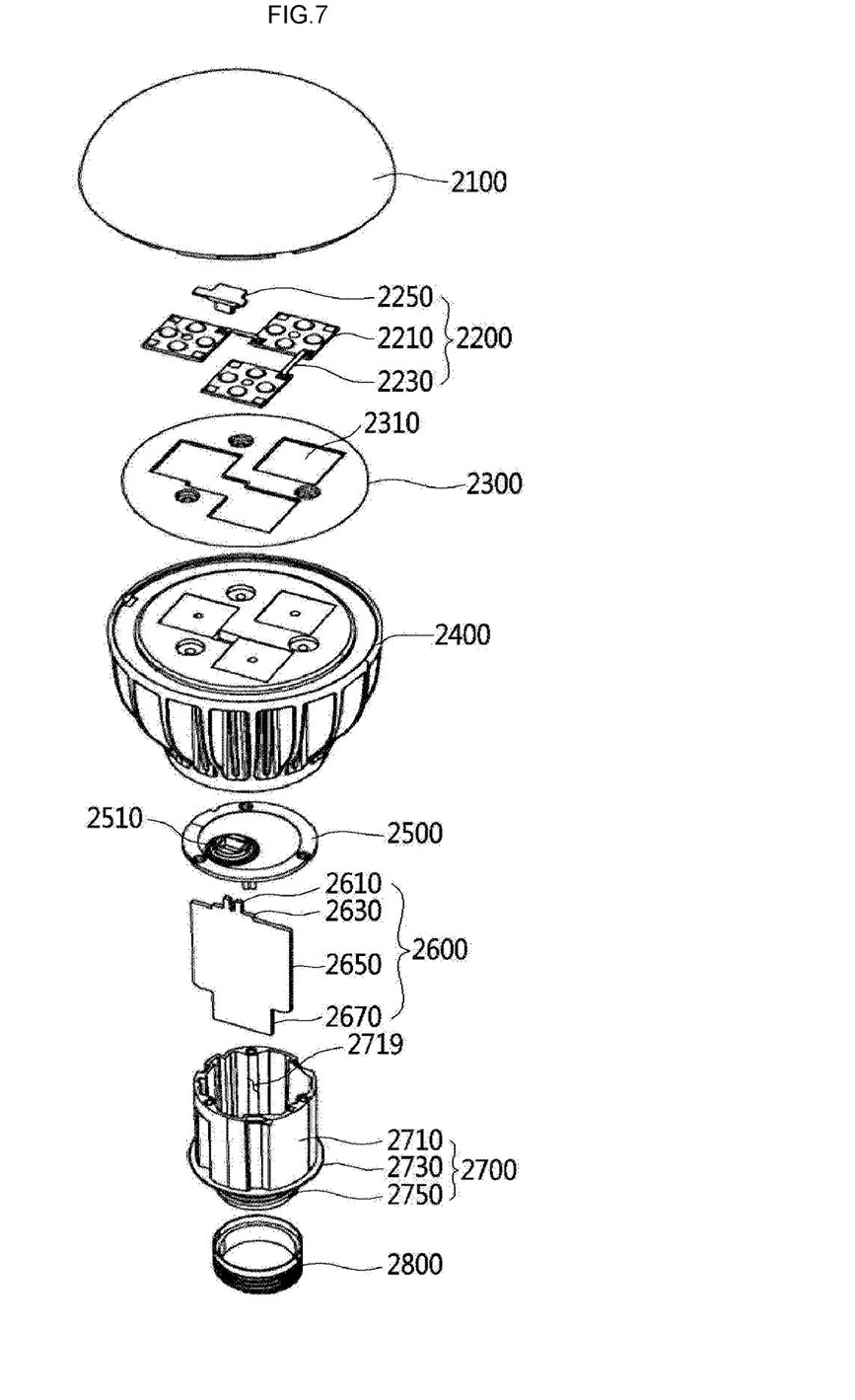
Figure 8:
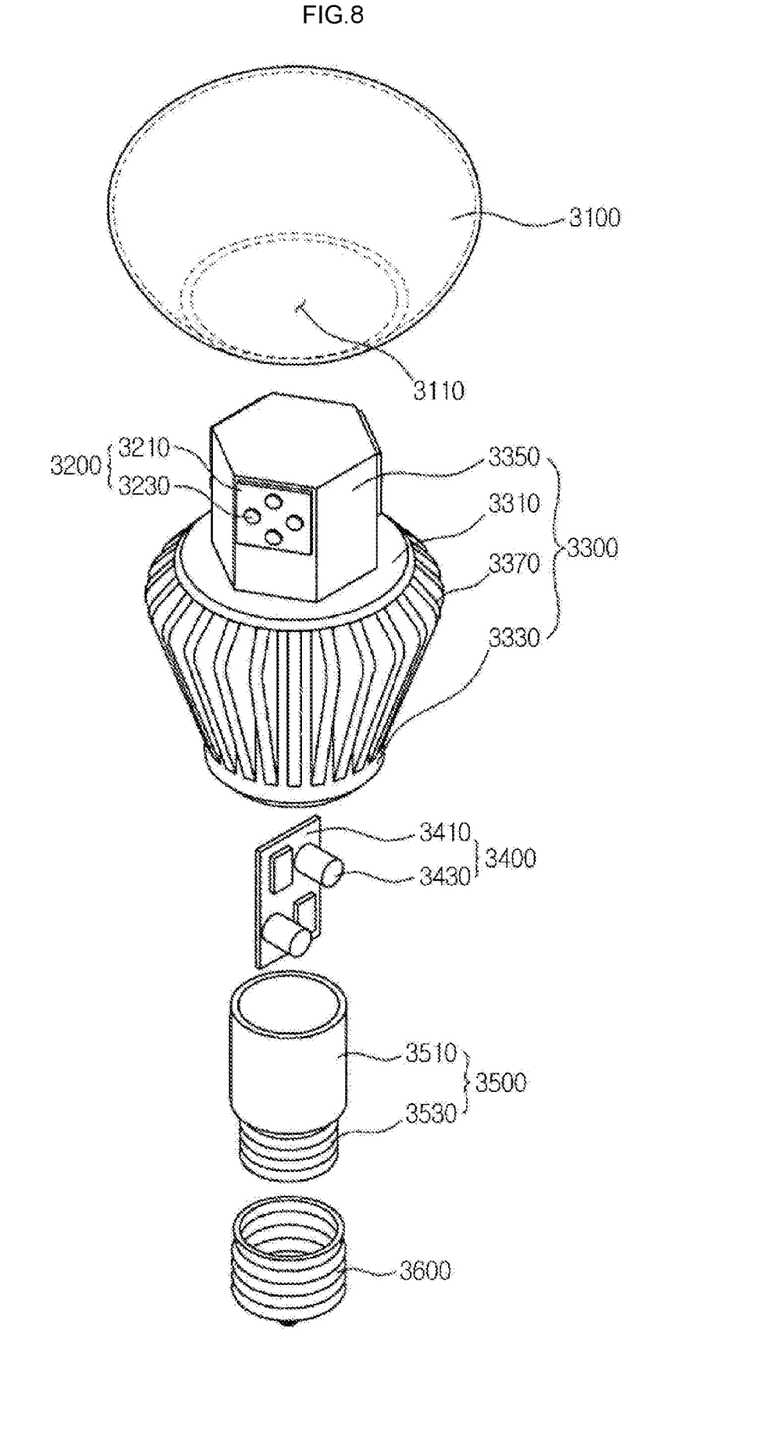

FIGS. 6 to 8 are exploded perspective views of embodiments of a light system including a light emitting device according to an embodiment.

FIG. 6 is a sectional view of a light emitting device package according to the embodiment. The light emitting device package according to the embodiment may have a light emitting device of embodiments disclosed previously herein.

A light emitting device package 200 may include a package body 205, third and fourth electrode layers 213 and 214 provided on the package body 205, the light emitting device 100 provided on the package body 205 and electrically connected with the third and fourth electrode layers 213 and 214, and a molding member 230 to surround the light emitting device 100.

The package body 205 may include, for example, a silicon material, a synthetic resin material, or a metallic material, and may have inclined surfaces formed around the light emitting device 100. The light emitting device 100 may be provided on the package body 205 or may be provided on the third and fourth electrode layers 213 and 214.

The third and fourth electrode layers 213 and 214 may be electrically insulated from each other and supplies power to the light emitting device 100. In addition, the third and fourth electrode layers 213 and 214 may reflect the light emitted from the light emitting device 100 to increase light efficiency and may discharge heat emitted from the light emitting device 100 to the outside.

The light emitting device 100 may be electrically connected with the third electrode layer 213 and/or the fourth electrode layer 214 through one of a wire scheme, a flip-chip scheme, or a die-bonding scheme. Although the light emitting device 100 may be electrically connected with the third electrode layer 213 and the fourth electrode layer 214 via wires as shown in FIG. 6, the embodiment is not limited thereto.

The molding member 230 may surround the light emitting device 100 to protect the light emitting device 100. A phosphor 232 may be contained in the molding member 230 to change the wavelength of light emitted from the light emitting device 100.

FIGS. 7 and 8 are views of a light system according to an embodiment. As shown in FIG. 7, the light system according to the embodiment may include a cover 2100, a light source module 2200, a radiator 2400, a power supply part 2600, an inner case 2700, and a socket 2800. The light system according to the embodiment may further include at least one of a member 2300 and a holder 2500. The light source module 2200 may include the light emitting device 100 or the light emitting device package 200 according to embodiments disclosed herein.

The cover 2100 may have, e.g., a bulb shape, a hemisphere shape, and/or a partially-open hollow shape. The cover 2100 may be optically coupled to the light source module 2200. For example, the cover 2100 may diffuse, scatter, or excite light provided from the light source module 2200. The cover 2100 may be a type of optical member. The cover 2100 may be coupled to the radiator 2400. The cover 2100 may include a coupling part, which may be coupled to the radiator 2400.

The cover 2100 may include an inner surface coated with a milk-white paint. The milk-white paint may include a diffusion material to diffuse light. The cover 2100 may have an inner surface of which surface roughness may be greater than that of the outer surface thereof. The surface roughness may be provided for sufficiently scattering and diffusing the light from the light source module 2200.

A material of the cover 2100 may include, for example, glass, plastic, polypropylene (PP), polyethylene (PE), and polycarbonate (PC). The polycarbonate (PC) may have a superior light resistance, heat resistance and strength among the above materials. The cover 2100 may be transparent so that a user may view the light source module 2200 from the outside, or the cover 2100 may be opaque. The cover 2100 may be formed through a blow molding scheme.

The light source module 2200 may be provided at a surface of the radiator 2400. Accordingly, heat from the light source module 2200 may be conducted to the radiator 2400.

The light source module 2200 may include, for example, a light source 2210, a connection plate 2230, and a connector 2250.

The member 2300 may be provided at a top surface of the radiator 2400 and may include guide grooves 2310 into which a plurality of light sources 2210 and the connector 2250 may be inserted. The guide grooves 2310 may correspond to a substrate of the light source 2210 and the connector 2250.

A light reflective material may be applied to or coated on a surface of the member 2300. For example, white paint may be applied to or coated on the surface of the member 2300. The member 2300 may then reflect light, which may be reflected by the inner surface of the cover 2100 and returned to the direction of the light source module 2200, to the direction of the cover 2100. Accordingly, light efficiency of the light system according to the embodiment may be improved.

For example, the member 2300 may include an insulating material. The connection plate 2230 of the light source module 2200 may include an electrically conductive material. The radiator 2400 may be electrically connected to the connection plate 2230. The member 2300 may include an insulating material, thereby preventing the connection plate 2230 from being electrically shorted with the radiator 2400. The radiator 2400 may receive heat from the light source module 2200 and the power supply part 2600 and may radiate the heat.

The holder 2500 may cover a receiving groove 2719 of an insulating part 2710 of an inner case 2700. Accordingly, the power supply part 2600 received in the insulating part 2710 of the inner case 2700 may be sealed. The holder 2500 may have a guide protrusion 2510. The guide protrusion 2510 may have a hole through a protrusion 2610 of the power supply part 2600.

The power supply part 2600 may process or convert an external electric signal received and provide the processed or converted electric signal to the light source module 2200. The power supply part 2600 may be received in the receiving groove of the inner case 2700 and may be sealed inside the inner case 2700 by the holder 2500.

The power supply part 2600 may include a protrusion 2610, a guide part 2630, a base 2650, and an extension part 2670. The guide part 2630 may have a shape protruding outward from a side of the base 2650. The guide part 2630 may be inserted into the holder 2500. A plurality of components may be provided on a surface of the base 2650. For example, the components may include a DC converter converting AC power provided from an external power supply into DC power, a driving chip to control driving of the light source module 2200, and an ESD protection device to protect the light source module 2200, but the embodiment is not limited thereto.

The extension part 2670 may have a shape protruding outward from an opposite side of the base 2650. The extension part 2670 may be inserted into an inside of the connection part 2750 of the inner case 2700 and receive an external electric signal. For example, a width of the extension part 2670 may be smaller than or equal to a width of the connection part 2750 of the inner case 2700. An end of a "+ electric wire" and an end of a "− electric wire" may be electrically connected to the extension part 2670 and opposite ends of the "+ electric wire" and the "− electric wire" may be electrically connected to a socket 2800.

The inner case 2700 may include a molding part and the power supply part 2600. The molding part may be formed by hardening molding liquid, and the power supply part 2600 may be fixed into the inner case 2700 by the molding part.

As shown in FIG. 8, the light system according to the embodiment may include a cover 3100, a light source part 3200, a radiator 3300, a circuit part 3400, an inner case 3500, and a socket 3600. The light source part 3200 may include the light emitting device or the light emitting device package according to embodiments disclosed herein.

The cover 3100 may have a bulb shape in a hollow structure. The cover 3100 may have an opening 3110. The light source part 3200 and a member 3350 may be inserted through the opening 3110. The cover 3100 may be coupled to the radiator 3300 and may surround the light source part 3200 and the member 3350. The light source part 3200 and the member 3350 may be blocked from the outside by a coupling between the cover 3100 and the radiator 3300. The cover 3100 may be coupled to the radiator 3300 by an adhesive or various schemes such as, e.g., a rotation coupling scheme and a hook coupling scheme. The rotation coupling scheme may be a scheme where a thread of the cover 3100 may be coupled to a screw groove of the radiator 3300, and the cover 3100 may be coupled to the radiator 3300 by rotation of the cover 3100. The hook coupling scheme may be a scheme where a step of the cover 3100 may be inserted into a groove of the radiator 3300 so that the cover 3100 may be coupled to the radiator 3300.

The cover 3100 may be optically coupled to the light source part 3200. The cover 3100 may diffuse, scatter, or excite light provided from a light emitting device 3230 of the light source part 3200. The cover 3100 may be a type of an optical member. The cover 3100 may be provided at an inner surface or an outer surface or an inside thereof with a phosphor to excite light supplied from the light source part 3200.

The cover 3100 may include an inner surface coated with a milk-white paint. The milk-white paint may include a diffusion material to diffuse light. The cover 3100 may have the inner surface of which surface roughness may be greater than that of the outer surface thereof. The surface roughness may be provided for the purpose of sufficiently scattering and diffusing the light from the light source part 3200.

A material of the cover 3100 may include, e.g., glass, plastic, polypropylene (PP), polyethylene (PE), and polycarbonate (PC). The polycarbonate (PC) may have excellent light resistance, heat resistance and strength among the above materials. The cover 3100 may include a transparent material allowing a user to view the light source part 3200 and the member 3350 from the outside or an opaque material to prevent the light source part 3200 and the member 3350 from being viewed. The cover 3100 may be formed through a blow molding scheme.

The light source part 3200 may be provided at the member 3350 of the radiator 3300, and a plurality of light source parts may be provided. The light source part 3200 may be provided on at least one of a plurality of lateral sides of the member 3350. The light source part 3200 may be provided on an upper end of the lateral side of the member 3350.

The light source part 3200 may be provided at three of six lateral sides of the member 3350, but the embodiment is not limited thereto. The light source part 3200 may be provided at all lateral sides of the member 3350. The light source part 3200 may include a substrate 3210 and a light emitting device 3230. The light emitting device 3230 may be provided on one surface of the substrate 3210.

The substrate 3210 may have a rectangular plate shape, but the embodiment is not limited thereto. The substrate 3210 may have various shapes. For example, the substrate 3210 may have a circular plate shape or a polygonal plate shape. The substrate 3210 may be provided by printing a circuit pattern on an insulator. For example, the substrate 3210 may include, e.g., a typical printed circuit board (PCB), a metal core PCB, a flexible PCB, and a ceramic PCB. The substrate may have a COB (chips on board) type in which LED chips, which may not be packaged, may be directly bonded on the PCB. The substrate 3210 may include a material to effectively reflect light, or the surface of the substrate may have a color, such as a gold color or a silver color, to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting device chip to emit red, green, and blue lights or a light emitting device chip to emit UV light. The light emitting device chip may have a lateral type or a vertical type. The light emitting device chip may emit one of blue, red, yellow, and green lights.

The light emitting device 3230 may have a phosphor. The phosphor may include at least one of garnet-based phosphors (YAG, or TAG), silicate-based phosphors, nitride-based phosphors, and oxynitride-based phosphors. The phosphor may include at least one of yellow, green, and red phosphors.

The radiator 3300 may be coupled to the cover 3100 to radiate heat from the light source part 3200. The radiator 330 may have a predetermined volume and may include a top surface 3310 and a lateral side 3330. The member 3350 may be provided on the top surface 3310 of the radiator 3310. The top surface 3310 of the radiator 3300 may be coupled to the cover 3100. The top surface 3310 of the radiator 3300 may have a shape corresponding to an opening 3110 of the cover 3100.

A plurality of heat radiation pins 3370 may be provided at the lateral side 3330 of the radiator 3300. The heat radiation pin 3370 may extend outward from the lateral side 3330 of the radiator 3300 or may be connected to the lateral side 3330 of the radiator 3300. The heat radiation pin 3370 may improve heat radiation efficiency by widening a heat radiation area of the radiator 3300. The lateral side 3330 may not include the heat radiation pin 3370.

The member 3350 may be provided on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be provided at six lateral sides of the member 3350. The light source part 3200 may be provided at all or some of the six lateral sides of the member 3350. The light source part 3200 may be provided at three of the six lateral sides of the member 3350 as shown in FIG. 8.

The substrate 3210 may be provided at the lateral side of the member 3350. The lateral side of the member 3350 may be substantially vertical to the top surface 3310 of the radiator 3300. Accordingly, the substrate 3210 and the top surface of the radiator 3300 may be substantially vertical to each other.

The member 3350 may include a material representing thermal conductivity. Thus, heat from the light source part 3200 may be rapidly transferred to the member 3350. For example, the material for the member 3350 may include aluminum (Al), nickel (Ni), copper (Cu), magnesium (Mg), silver (Ag), tin (Sn), and alloys thereof. The member 3350 may include a plastic having thermal conductivity. The plastic having thermal conductivity may be lighter than the metal and may have thermal conductivity in a single direction.

The circuit part 3400 may receive external power and may convert the received power for the light source part 3200. The circuit part 3400 may provide the converted power to the light source part 3200. The circuit part 3400 may be provided in the radiator 3300. The circuit part 3400 may be received in the internal case 3500 or may be received in the radiator 3300 together with the internal case 3500. The circuit part 3400 may include a circuit substrate 3410 and a plurality of components 3430 mounted on the circuit substrate 3410.

The circuit board 3410 may have a circular plate shape, but the embodiment is not limited thereto. For example, the circuit board 3410 may have an oval plate shape or a polygonal plate shape. The circuit board 3410 may be provided by printing a circuit pattern on an insulator.

The circuit board 3410 may be electrically connected with the substrate 3210 of the light source part 3200. For example, the circuit board 3410 and the substrate 3210 may be electrically connected to each other by a wire. The wire may be provided inside the radiator 3300 to connect the substrate 3210 with the circuit board 3410.

For example, a plurality of components 3430 may include a direct current converter to convert AC power provided from an external power supply into DC power, a driving chip to control the driving of the light source part 3200, and an ESD protection device to protect the light source part 3200.

The inner case 3500 may receive the circuit part 3400 therein. The inner case 3500 may include a receiving part 3510 to receive the circuit part 3400. For example, the receiving part 3510 may have a cylindrical shape. The shape of the receiving part 3510 may be varied depending on the shape of the radiator 3300. The inner case 3500 may be received in the radiator 3300. The receiving part 3510 of the inner case 3500 may be received in a receiving part formed at a bottom surface of the radiator 3300.

The inner case 3500 may be coupled to the socket 3600. The inner case 3500 may include a connecting part 3530 coupled to the socket 3600. The connecting part 3530 may have a thread structure corresponding to a screw groove structure of the socket 3600. The inner case 3500 may be an insulator. Accordingly, the inner case 3500 may prevent electric short between the circuit part 3400 and the radiator 3300. For example, the inner case 3500 may include a plastic or resin material.

The socket 3600 may be coupled to the inner case 3500. The socket 3600 may be coupled to the connecting part 3530 of the inner case 3500. The socket 3600 may have a same or similar structure as a conventional incandescent light bulb. The socket 3600 may be electrically connected with the circuit part 3400. For example, the circuit part 3400 and the socket 3600 may be electrically connected to each other by a wire. If external power is applied to the socket 3600, the external power may be transferred to the circuit part 3400.

The socket 3600 may have a screw groove structure corresponding to a thread structure of the connecting part 3550.

Embodiments disclosed herein may provide a light emitting device including a schottky guide ring for protection from ESD shock, a light emitting device package, and a light system.

According to embodiments disclosed herein, a light emitting device may include a substrate, a light emitting structure including a first conductive semiconductor layer, an active layer, and a second conductive semiconductor layer on the substrate, a first electrode on the first conductive semiconductor layer, and a schottky guide ring surrounding the first electrode and directly connected with the first conductive semiconductor layer.

The active layer may be protected from ESD shock by including the schottky guide ring. Embodiments disclosed herein may lower a current concentration phenomenon and an intensity of the electric field.

In addition, according to embodiments disclosed herein, light efficiency of the light emitting device package may be improved as a zener diode may be omitted.

It will be understood that, when a layer (or film), an area, a pattern, or a structure is referred to as being "on" or "under" another substrate, another layer (or film), another area, another pad, or another pattern, it can be "directly" or "indirectly" over the other substrate, layer (or film), area, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a light emitting structure including a first conductive semiconductor layer, an active layer, and a second conductive semiconductor layer provided on the substrate;
a first electrode on the first conductive semiconductor layer;
a schottky guide ring configured to surround the first electrode and directly connect with the first conductive semiconductor layer; and
an insulating layer between the first electrode and the schottky guide ring, wherein the schottky guide ring includes:
  a first schottky guide ring on the insulating layer; and
  a second schottky guide ring and a third schottky guide ring configured to pass through the insulating layer.

2. The light emitting device of claim 1, wherein the first schottky guide ring includes a first metallic layer and a second metallic layer, wherein the first metallic layer includes at least one of silver (Ag) and aluminum (Al), and the second metallic layer includes nickel (Ni).

3. The light emitting device of claim 2, wherein the first metallic layer has a thickness in a range of 200 nm to 300 nm, and the second metallic layer has a thickness in a range of 0.5 nm to 2 nm.

4. The light emitting device of claim 1, wherein the schottky guide ring has at least one protrusion at sides thereof.

5. The light emitting device of claim 4, wherein each protrusion has a width in a range of 2 µm to 3 µm.

6. The light emitting device of claim 1, wherein the second schottky guide ring and the third schottky guide ring each have heights in a range of 0.7 µm to 1 µm.

7. The light emitting device of claim 1, wherein a width of an interval between the first electrode and the second schottky guide ring is equal to a width of an interval between the first electrode and the third schottky guide ring.

8. The light emitting device of claim 7, wherein the width of the interval between the first electrode and the second schottky guide ring and the width of the interval between the first electrode and the third schottky guide ring are 0.5 µm or less.

9. The light emitting device of claim 1, further comprising a fourth schottky guide ring configured to connect the first schottky guide ring to the first electrode.

10. The light emitting device of claim 1, wherein the schottky guide ring is configured to surround the first electrode.

11. A light system comprising the light emitting device according to claim 1.

12. A light emitting device comprising:
  a substrate;
  a light emitting structure including a first conductive semiconductor layer, an active layer, and a second conductive semiconductor layer on the substrate;
  a first electrode on the first conductive semiconductor layer;
  a schottky guide ring configured to surround the first electrode and directly connected with the first conductive semiconductor layer;
  a first insulating layer between the first electrode and the schottky guide ring;
  a second insulating layer on the first insulating layer; and
  a second schottky guide ring configured to directly connect with the schottky guide ring.

13. The light emitting device of claim 12, wherein the second schottky guide ring includes:
  a third schottky guide ring passing through the second insulating layer; and
  a fourth schottky guide ring provided on the second insulating layer and configured to connect with the third schottky guide ring.

14. The light emitting device of claim 13, further comprising a fifth schottky guide ring passing through the second insulating layer and configured to vertically connect with the first schottky guide ring.

15. The light emitting device of claim 14, further comprising a sixth schottky guide ring provided on the second insulating layer and configured to vertically connect with the fifth schottky guide ring.

16. The light emitting device of claim 14, wherein the fifth schottky guide ring has a width equal to a width of the first electrode.

17. The light emitting device of claim 13, wherein a width of an interval between the first electrode and the second schottky guide ring is equal to a width an interval between the first electrode and the third schottky guide ring.

18. The light emitting device of claim 13, wherein the width of the interval between the first electrode and the second schottky guide ring and the width of the interval between the first electrode and the third schottky guide ring is 0.5 µm or less.

19. A light system compromising the light emitting device according to claim 12.

20. The light emitting device of claim 1, wherein the first schottky guide ring is connected to both the second schottky guide ring and the third schottky guide ring.

21. The light emitting device of claim 1, wherein the second schottky guide ring and the third schottky guide ring are in contact with the first conductive semiconductor layer.

22. The light emitting device of claim 4, wherein each protrusion is disposed on the insulating layer.

* * * * *